(12) United States Patent
Ushijima et al.

(10) Patent No.: US 9,691,870 B2
(45) Date of Patent: Jun. 27, 2017

(54) SEMICONDUCTOR DEVICE

(71) Applicant: TOYOTA JIDOSHA KABUSHIKI KAISHA, Toyota-Shi, Aichi-Ken (JP)

(72) Inventors: Takashi Ushijima, Nagoya (JP); Tsuyoshi Nishiwaki, Nagoya (JP); Masakazu Okada, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 14/959,944

(22) Filed: Dec. 4, 2015

(65) Prior Publication Data
US 2016/0163812 A1   Jun. 9, 2016

(30) Foreign Application Priority Data

Dec. 8, 2014 (JP) ................................. 2014-248122

(51) Int. Cl.
| | | |
|---|---|---|
| *H01L 23/52* | (2006.01) | |
| *H01L 29/45* | (2006.01) | |
| *H01L 29/417* | (2006.01) | |
| *C22C 21/00* | (2006.01) | |

(52) U.S. Cl.
CPC .......... *H01L 29/456* (2013.01); *C22C 21/003* (2013.01); *H01L 29/417* (2013.01)

(58) Field of Classification Search
CPC ............................ H01L 29/456; H01L 29/417
USPC ...................................................... 257/740
See application file for complete search history.

(56) References Cited

U.S. PATENT DOCUMENTS

| | | | |
|---|---|---|---|
| 4,492,813 A | 1/1985 | Kausche et al. | |
| 4,527,184 A | 7/1985 | Fischer | |
| 4,896,204 A * | 1/1990 | Hirata ............... | H01L 23/53223 257/765 |
| 5,243,202 A | 9/1993 | Mori et al. | |
| 5,369,244 A | 11/1994 | Kulikowski et al. | |
| 6,051,490 A | 4/2000 | Taguchi et al. | |
| 6,268,290 B1 * | 7/2001 | Taguchi ............ | H01L 21/76802 257/E21.577 |
| 8,373,176 B2 * | 2/2013 | Tamaso ............... | H01L 21/0485 257/77 |
| 8,558,381 B2 * | 10/2013 | Mizuno ............... | H01L 29/0619 257/741 |
| 9,177,856 B2 * | 11/2015 | Horii ................. | H01L 21/76841 |
| 2007/0004098 A1 | 1/2007 | Kazama et al. | |
| 2015/0171016 A1 | 6/2015 | Okuno et al. | |

FOREIGN PATENT DOCUMENTS

| | | | |
|---|---|---|---|
| JP | S59-108348 A | 6/1984 | |
| JP | S60-251663 A | 12/1985 | |
| JP | S62-133714 A | 6/1987 | |
| JP | S64-071176 A | 3/1989 | |
| JP | H05-347307 A | 12/1993 | |

(Continued)

*Primary Examiner* — Luan C Thai
(74) *Attorney, Agent, or Firm* — Oliff PLC (57) ABSTRACT

A semiconductor device including a semiconductor substrate and an electrode formed from an alloy containing aluminum, silicon and titanium. The silicon content in the electrode is from 0.5 to 1.0% by weight relative to the total weight of the electrode, the titanium content in the electrode is from 0.8 to 3.0% by weight relative to the total weight of the electrode, and the thickness of the electrode is at least 1 μm.

19 Claims, 4 Drawing Sheets

(56) References Cited

FOREIGN PATENT DOCUMENTS

| | | |
|---|---|---|
| JP | 2007-036211 A | 2/2007 |
| JP | 2012-243876 A | 12/2012 |
| JP | 2014-154667 A | 8/2014 |

* cited by examiner

SEMICONDUCTOR DEVICE

PRIORITY INFORMATION

This application claims priority to Japanese Patent Application No. 2014-248122, filed on Dec. 8, 2014, which is incorporated herein by reference in its entirety.

TECHNICAL FIELD

Preferred embodiments relate to a semiconductor device, and relate particularly to a semiconductor device comprising a semiconductor substrate, and an electrode formed from an alloy containing aluminum, silicon and titanium.

BACKGROUND

In semiconductor devices in which an aluminum electrode is provided in contact with a semiconductor substrate, heat treatments such as reflow soldering and sintering treatments performed after the formation of the aluminum electrode can sometimes cause mutual diffusion between the silicon (Si) of the semiconductor substrate and the aluminum (Al) of the electrode, resulting in Al spiking. One known technique for suppressing this Al spiking involves using an Al—Si electrode in which the layer of the electrode that contacts the semiconductor substrate is formed from a film of an aluminum-silicon (Al—Si) alloy. By using such an Al—Si electrode, the occurrence of Al spiking in electrodes provided in contact with the semiconductor substrate is suppressed.

On the other hand, when an Al—Si electrode is used, another problem arises in that following the types of heat treatments described above, the Si that does not undergo solid dissolution in Al may precipitate, forming Si nodules. These Si nodules formed at the interface between the electrode and the semiconductor substrate reduce the effective surface area of the electrode, and may also be retained following etching of the Al.

In JP S64-71176 A, in order to suppress the formation of Si nodules, a wiring electrode formed from a film of an aluminum-silicon-titanium (Al—Si—Ti) alloy is connected to a semiconductor substrate with a metal silicide film disposed therebetween. In the semiconductor device of JP S64-71176 A, the precipitated Si is reacted with the Ti and consumed as titanium silicide (TiSix), thereby suppressing Si deposition.

SUMMARY

Power semiconductor devices such as IGBTs (Insulated Gate Bipolar Transistors), MOSFETs (Metal Oxide Semiconductor Field Effect Transistors) and thyristors are used as power devices in automobiles and the like. Conventionally, these semiconductor devices have been installed in locations distant from components that generate heat such as engines or motors, but henceforth, it is expected that these semiconductor devices will also need to be used in high-temperature environments closer to these types of heat-generating components. Further, as the electric current processed by these types of semiconductor devices increases, it is expected that the amount of heat generated inside the semiconductor devices will also increase, resulting in an increase in the temperature of the semiconductor devices.

When a semiconductor device is used under these types of high-temperature conditions, the strain on members such as Al alloy electrodes formed on the semiconductor substrate, protective films such as polyimide films, and stacked metal electrodes and the like may sometimes increase. For example, when a semiconductor device is used in an operating environment of 100° C. or higher (an increase of about 25° C. or more from conventionally assumed operating environments), calculations predict an approximately two-fold increase in the strain amplitude in an Al alloy electrode.

It would be very desirable to increase the mechanical strength of an Al alloy electrode, while suppressing any increase in the strain amplitude.

A semiconductor device according to a preferred embodiment comprises a semiconductor substrate, and an electrode formed from an alloy containing aluminum, silicon and titanium. The silicon content in the electrode is from 0.5 to 1.0% by weight relative to the total weight of the electrode, the titanium content in the electrode is from 0.8 to 3.0% by weight relative to the total weight of the electrode, and the thickness of the electrode is at least 1 μm.

In another aspect, the average particle size of metal crystals contained in the electrode in the above semiconductor device is not more than 1 μm.

In yet another aspect, the titanium content in the electrode in the above semiconductor device is from 0.8 to 2.0% by weight relative to the total weight of the electrode.

The preferred embodiments can provide a semiconductor device which has improved mechanical strength for the electrode, and exhibits superior durability to stress, even when used under high-temperature conditions.

BRIEF DESCRIPTION OF THE DRAWINGS

Preferred embodiments will be described in detail based on the following figures, wherein.

DETAILED DESCRIPTION

Figure 1:
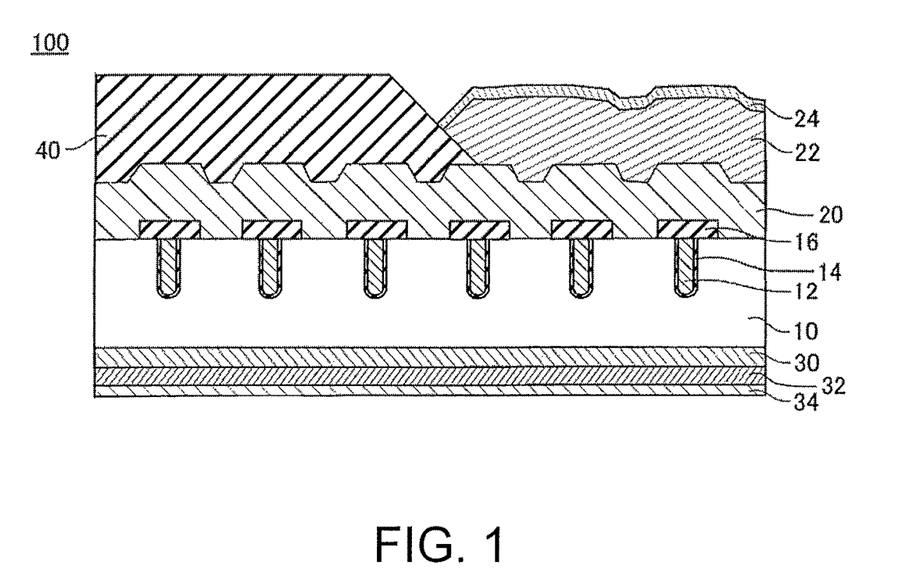
FIG. 1 is a diagram illustrating a schematic cross-section of a semiconductor device according to an embodiment.

Preferred embodiments (hereafter referred to simply as embodiments) are described below with reference to the drawings. As illustrated in FIG. 1, a semiconductor device 100 according to an embodiment comprises a semiconductor substrate 10, a surface electrode 20, and a back electrode 30. This semiconductor device is a trench-type IGBT, which can be used in inverters and converters and the like used in the motor drives of electric vehicles and the like, and carries a large current of several hundred A or more.

In FIG. 1, structures that repeat along the horizontal direction of the semiconductor device 100 are omitted. The semiconductor substrate 10 comprises an emitter layer, a base layer and a collector layer, formed in that order from the surface side toward the back surface, and trenches are provided which penetrate through the emitter layer and reach the base layer. A gate insulating film 14 is formed on the inner walls of each trench, and a gate electrode 12 is provided so as to fill the trenches. The upper surface of the gate electrode 12 is covered with an interlayer insulating film 16.

A surface electrode 20 formed from an Al—Ti—Si alloy according to the present embodiment is provided so as to cover the emitter layer of the IGBT of the semiconductor substrate 10 and the interlayer insulating film 16. This surface electrode 20 functions as the emitter electrode. A second surface electrode 22 formed from nickel is provided on top of the surface electrode 20, and a third surface electrode 24 formed from gold is provided on top of the second surface electrode 22. The third surface electrode 24 is connected to the lead electrode of another device via a solder layer. Further, a polyimide film 40 that functions as a protective film is formed on a portion of the surface of the surface electrode 20. Portions of the second surface electrode 22, the third surface electrode 24 and the solder layer extend over the edge of the polyimide film 40.

FIG. 1 illustrates an example in which the second surface electrode 22 and the third surface electrode 24 are provided, but the second surface electrode 22 and the third surface electrode 24 need not necessarily be provided. In such a case, a wire or ribbon line formed from Al or an Al alloy or the like is connected directly to the surface electrode 20.

The back electrode 30 is provided in contact with the collector layer of the IGBT of the semiconductor substrate 10. A second back electrode 32 formed from nickel and a third back electrode 34 formed from gold are stacked on the back electrode 30, and the third back electrode 34 is connected to a printed circuit board electrode via a solder layer.

FIG. 1 illustrates an example in which the electrode formed from the Al—Ti—Si alloy according to the present embodiment is provided as the surface electrode 20 on the emitter region side of the semiconductor substrate 10, but the electrode formed from the Al—Ti—Si alloy may also be provided as the back electrode 30 on the collector region side of the semiconductor substrate 10.

The semiconductor device of the present embodiment has at least an electrode formed from an alloy (Al—Ti—Si alloy) having aluminum (Al) as the main component but also containing titanium (Ti) and silicon (Si).

The thickness of the electrode formed from the Al—Ti—Si alloy according to the present embodiment is at least 1 μm. Here, the "thickness of the electrode" refers to the average value of the thickness of the film formed from the Al—Ti—Si alloy. There are no particular limitations on the upper limit for the thickness of the electrode, but the thickness is, for example, typically not more than 10 μm. If the thickness of the electrode formed from the Al—Ti—Si alloy is less than 1 μm, then the flow of electric current and heat through the wire used for connecting the electrode to an external terminal tends to be inhibited in the in-plane direction. Accordingly, an ideal electrode thickness for the transistors used in the inverters and converters that drive the motors for vehicles is preferably at least 3 μm but not more than 8 μm, and more preferably at least 4 μm but not more than 6 μm.

The electrode of the present embodiment contains aluminum (Al) as the main component. In this description, the expression "main component" means that the aluminum content in the electrode is, for example, from 96 to 98.7% by weight relative to the total weight of the electrode. In the following description, unless specifically stated otherwise, the term "content" used in relation to a metal contained within the Al—Ti—Si alloy in the electrode of the present embodiment refers to the "content relative to the total weight of the electrode".

The titanium (Ti) content in the electrode of the present embodiment is from 0.8 to 3.0% by weight. In the electrode of the present embodiment, by including Ti in an amount within the above range, the growth of Al crystals is suppressed, and the reduced crystal size enables an improvement in the mechanical strength of the electrode to be achieved. Further, in the electrode of the present embodiment, by including Ti in an amount within the above range, the generation of Si nodules can be effectively suppressed.

In the electrode of the present embodiment, if the Ti content is too low, then the reduction in the size of the metal crystals in the electrode does not proceed satisfactorily, and the strength improvement cannot be achieved. Further, if the Ti content is too low, then there is a possibility that the effect of the Ti in suppressing the generation of Si nodules may weaken. On the other hand, as described below, even if the Ti content is increased beyond 3.0% by weight, it becomes difficult to achieve any further increase in the shear strength of the electrode. If the Ti content is too high, then because Ti has a higher electrical resistivity than Al, there is a possibility that the resistance of the electrode may increase, which can lead to a deterioration in conduction efficiency and an increase in device temperature.

From the viewpoint of achieving a balance between the mechanical strength and the resistivity of the electrode, the Ti content is preferably from 0.8 to 2.0% by weight. If the Ti content is 2.0% by weight, then an improvement in the mechanical strength of the electrode can be readily achieved, whereas because the resistivity of Ti is higher than that of Al, by ensuring that the Ti content is not more than 2.0% by weight, any increase in the resistivity can be suppressed. In terms of obtaining an electrode having superior mechanical strength, the Ti content is most preferably from 1.2 to 2.0% by weight.

Figure 2:
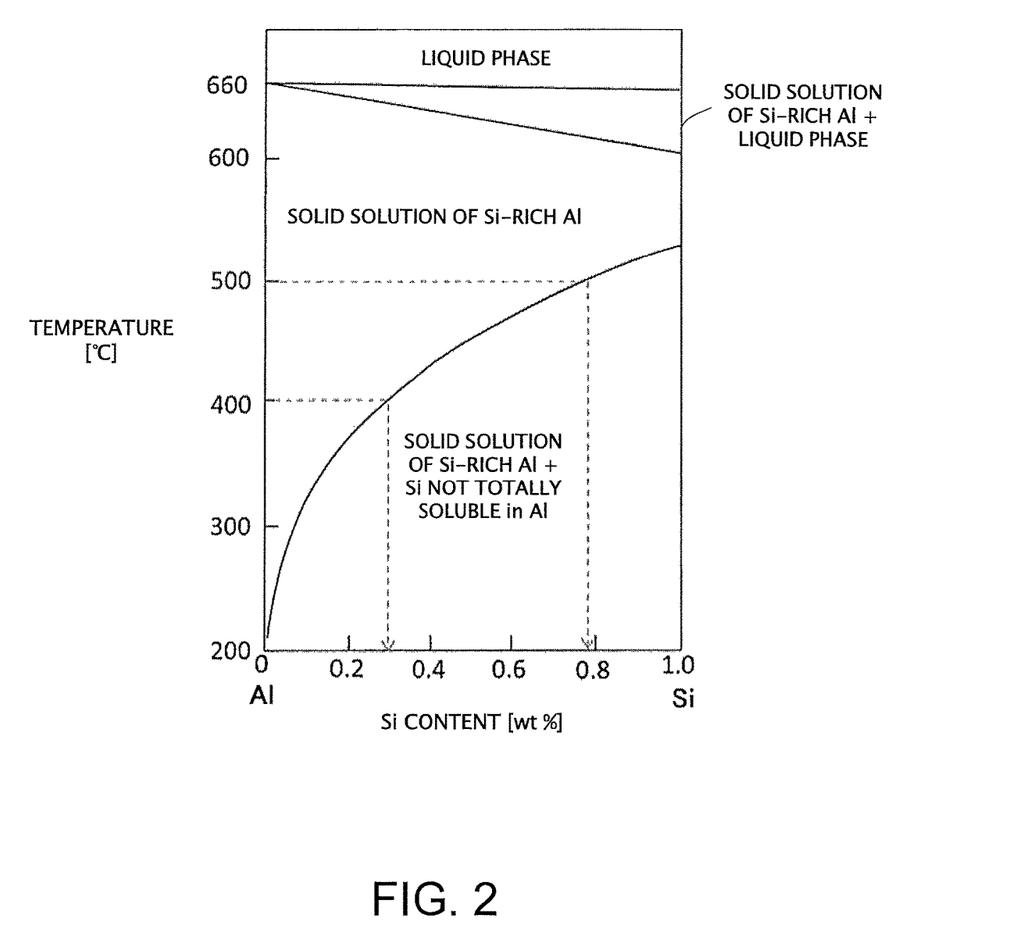
FIG. 2 is a phase diagram illustrating the solid solution state of Al—Si alloys.

The silicon (Si) content in the electrode of the present embodiment is from 0.5 to 1.0% by weight relative to the total weight of the electrode. The Si content is set on the basis of the temperature of the heat treatment performed during the production process for the semiconductor device. In the production process for the semiconductor device, in order to remove the resistance portion at the interface between the substrate and the electrode, thereby improving the connectivity at the interface, tests were performed in which, following the formation of the electrode on the surface of the semiconductor substrate, a heat treatment (sintering treatment) was performed at 400 to 500° C. under a hydrogen atmosphere. FIG. 2 is a phase diagram illustrating the solid solution state of Al—Si alloys. As illustrated in FIG. 2, the solubility limit of Si in Al at a temperature of 400 to 500° C. is about 0.3 to 0.8% by weight. In order to suppress the occurrence of Al spiking, the Si content in the electrode formed from the Al—Si alloy must exceed the solubility limit for Si in Al at the heat treatment temperature. On the other hand, the Si that does not dissolve in the Al may form Si nodules following the heat treatment, and therefore from the viewpoint of suppressing the formation of Si nodules, the Si content is preferably not too high.

For these reasons, the electrode of the present embodiment has a Si content that satisfies the above range. If the Si content is less than 0.5% by weight, then the solubility limit of Si in Al at the temperature during the heat treatment will exceed the Si content, meaning there is a possibility that the Si of the substrate may diffuse into the Al, with the Al of the electrode undergoing corresponding diffusion into the substrate and causing Al spiking. If the Si content exceeds 1.0% by weight, then there is a possibility that a significant amount of Si nodules may develop on the electrode following the heat treatment.

In the electrode formed from the Al—Ti—Si alloy that has undergone the heat treatment, it is thought that a portion of the excess Si that exceeds the solubility limit undergoes a reaction with a portion of the excess Ti that similarly exceeds the corresponding solubility limit, resulting in the formation of titanium silicides (TiSix) which are retained in the electrode. Further, it is also thought that a portion of the excess Ti that exceeds the solubility limit reacts with Al to form $TiAl_3$ which is also retained in the electrode.

The electrode formed from the Al—Ti—Si alloy in the semiconductor device of the present embodiment may also include metals other than Al, Ti or Si, and non-metallic substances, provided the effects of the semiconductor device of the present embodiment are not impaired.

In the electrode formed from the Al—Ti—Si alloy of the present embodiment, the average particle size of the incorporated metal crystals is preferably not more than 1 μm. The reason for this requirement is that if the average particle size of the metal crystals is 1 μm or less, then broadening of the particle size distribution for the metal crystals can be suppressed, meaning an Al—Ti—Si alloy film can be obtained in which the mechanical strength has been increased uniformly across the entire film. Further, an electrode of the present embodiment in which the average particle size of the metal crystals is 0.8 μm or less exhibits particularly superior shear strength. Although there are no particular limitations on the lower limit for the average particle size of the metal crystals, the average particle size is, for example, typically at least 0.01 μm, and preferably 0.1 μm or greater.

In the semiconductor device of the present embodiment, when the thickness of the electrode is at least 4 μm but not more than 6 μm, one particularly preferred configuration of the electrode has a Ti content of 0.8 to 2.0% by weight, a Si content of 0.5 to 1.0% by weight, and an average particle size of not more than 1 μm.

Examples of the method used for providing the electrode formed from the Al—Ti—Si alloy of the present embodiment on the semiconductor substrate include conventional techniques such as sputtering methods, CVD methods, vacuum deposition methods and plating methods. For reasons including ease of control of the electrode composition and the range for the desired electrode thickness, the electrode formed from the Al—Ti—Si alloy of the present embodiment is preferably formed using a sputtering method. The electrode formed from the Al—Ti—Si alloy in the semiconductor device of the present embodiment may be provided in direct contact with the semiconductor substrate, as illustrated in FIG. 1, or may be provided on the semiconductor substrate with another layer disposed therebetween.

Satisfying the demands for further increases in the output of semiconductor devices requires an increase in the thickness of the electrode. However, it is known that when a metal film is formed using a sputtering method, the particle size of the metal crystals that constitute the metal film increases in proportion with the thickness of the formed film. As the particle size of the metal crystals increases, there is a possibility that the mechanical strength of the metal film may deteriorate. However, by using the electrode formed from the Al—Ti—Si alloy of the present embodiment, an increase in the thickness of the electrode and a reduction in the size of the metal crystals that constitute the electrode can be achieved simultaneously, meaning that in an electrode of the present embodiment having a thickness that satisfies the range described above, a level of mechanical strength can be obtained that is capable of withstanding use under high-temperature conditions.

The electrode formed from the Al—Ti—Si alloy according to the present embodiment has improved mechanical strength, and particularly improved yield strength relative to tensile stress. In the present description, "yield strength" refers to the yield strength relative to tensile stress, and for example refers to a yield strength that results in a residual permanent deformation of 0.2% when a material is subjected to tensile deformation and the deformation is then stopped. The yield strength at this time is proportional to the shear strength, and therefore the yield strength of the Al alloy electrode relative to tensile deformation is evaluated by measuring the shear strength.

The shear strength of the electrode film can be measured using the SAICAS (Surface And Interfacial Cutting Analysis System) method. The SAICAS method is a method of measuring the peel strength and the shear strength of an adherend, and measurement is performed by cutting from the surface of the adherend to the interface and then performing peeling using a sharp blade having a prescribed rake angle, clearance angle and blade width. In the SAICAS method, the peel strength is determined as the force acting on the blade in the horizontal direction (the horizontal force per unit width of the blade), and the shear strength is determined from the force in the horizontal direction, the depth of the cut and the shear angle based on cutting theory. The shear strength of the electrode film determined by the SAICAS method can be measured using a Surface and Interface Property Analysis System (model: DN-GS) manufactured by Daipla Wintes Co., Ltd.

The composition of the electrode formed from the Al—Ti—Si alloy of the present embodiment can be measured quantitatively by the GD-OES (Glow Discharge Optical Emission Spectrometry) method. The GD-OES method is a technique in which a film sample is sputtered within an Ar glow discharge region, and the optical emission of the sputtered atoms in the Ar plasma is spectrally diffracted in a continuous manner to measure the element distribution through the thickness direction of the film sample.

The average particle size of the metal crystals in the electrode is measured using an EBSD (Electron Backscatter Diffraction) method. In the EBSD method, the diffraction image (Kikuchi pattern) of reflected electrons generated when the sample surface is irradiated with an electron beam inside a SEM (Scanning Electron Microscope) is measured, and by analyzing this image, the crystal orientation can be obtained for each irradiation position. By scanning the electron beam two-dimensionally across the sample surface and analyzing the diffraction image at a prescribed interval, the crystal orientation distribution of the sample surface can be obtained. By analyzing the thus obtained crystal orientation distribution, the type of crystals on the sample surface and the average particle size of each crystal type can be measured.

Figure 3:
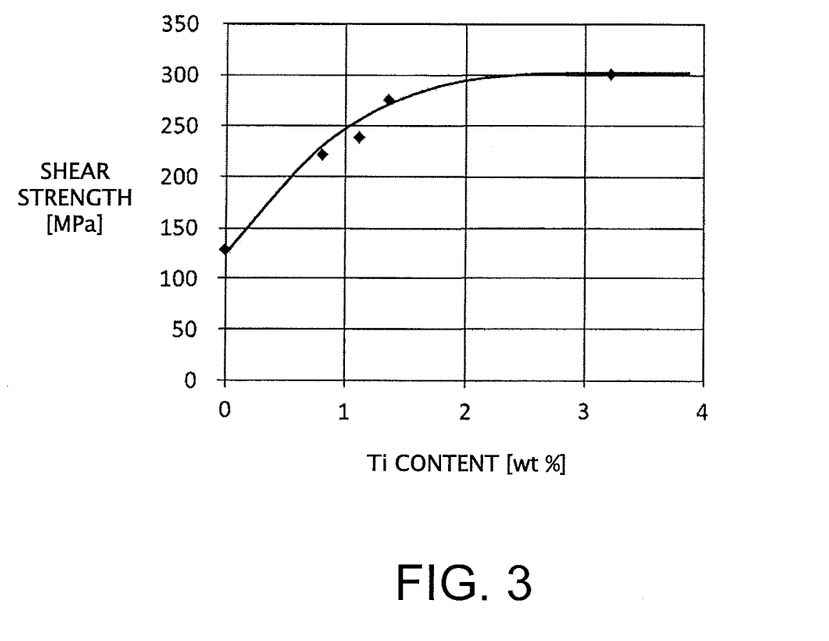
FIG. 3 is a diagram illustrating the relationship between the Ti content and the shear strength in Al—Ti—Si alloy films.

FIG. 3 illustrates the relationship between the Ti content (% by weight) and the shear strength (MPa) in films formed from Al—Ti—Si alloys. Using alloys in which the Ti content was 0% by weight (namely, contained no Ti), 0.8% by weight, 1.1% by weight, 1.3% by weight or 3.2% by weight, the Si content was about 1% by weight, and the remainder was Al, alloy films having a film thickness of 5 μm were formed by sputtering. The shear strength of each of the formed alloy films was measured by the SAICAS method using a Surface and Interface Property Analysis System (model: SAICAS (a registered trademark) DN-GS, manufactured by Daipla Wintes Co., Ltd.). The curve illustrated in FIG. 3 is a fitted curve drawn on the basis of the measurement results.

As is evident from FIG. 3, as the Ti content is increased from 0% by weight, the shear strength increases rapidly. When the Ti content exceeds about 0.8% by weight, the slope of the curve begins to moderate, and once the Ti content exceeds 2.0% by weight, the shear strength approaches a substantially constant value, with no further increases observed.

Figure 4:
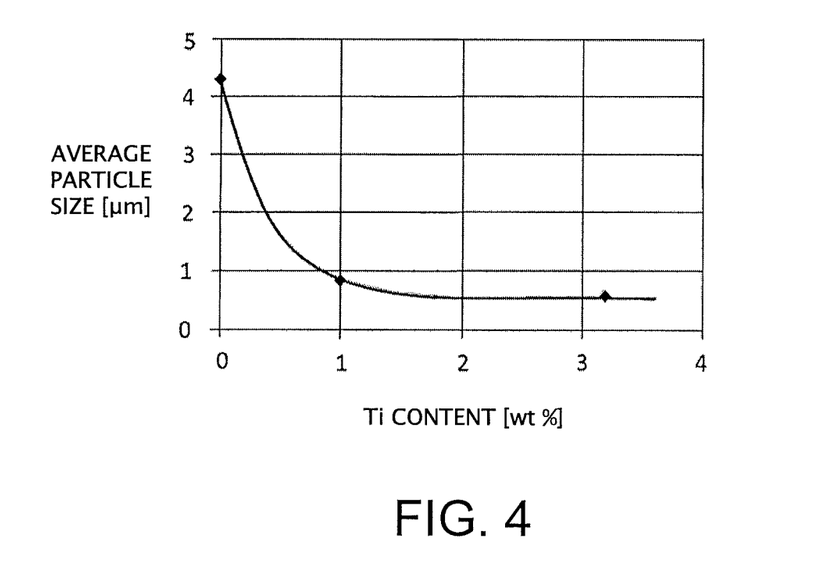
FIG. 4 is a diagram illustrating the relationship between the Ti content and the average particle size of the metal crystals in Al—Ti—Si alloy films.
Figure 5:
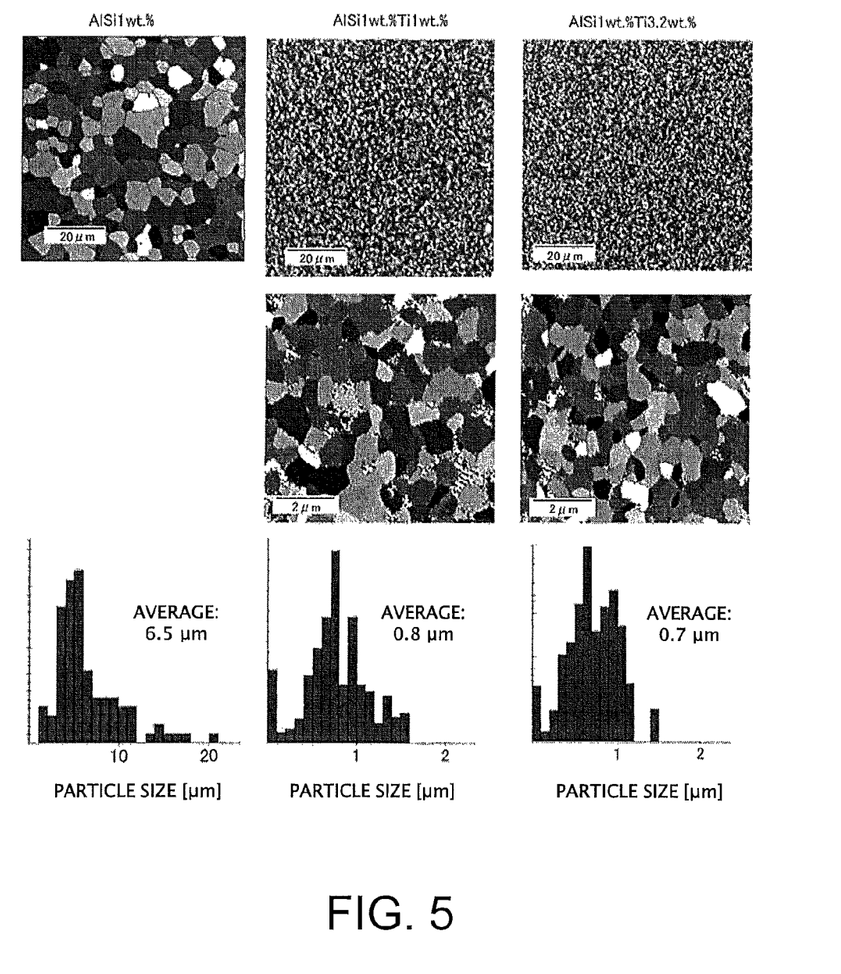
FIG. 5 is a diagram illustrating the orientation distribution and the particle size distribution of the metal crystals of Al—Ti—Si alloy films, measured using the EBSD method.

FIG. 4 illustrates the relationship between the Ti content (% by weight) and the average particle size (μm) of the metal crystals in films formed from Al—Ti—Si alloys. Using alloys in which the Ti content was 0% by weight (namely, contained no Ti), 1.0% by weight or 3.2% by weight, the Si content was 1.0% by weight, and the remainder was Al, alloy films having a film thickness of 5 μm were formed by sputtering. The average particle size in each of the formed alloy films was measured by the EBSD method. The measurements using the EBSD method were conducted using a Cross Section Polisher (a registered trademark) (CP) (SM-09010, manufactured by JEOL Ltd.), a Thermally-Assisted Field Emission Scanning Electron Microscope (TFE-SEM) (JSM-6500F, manufactured by JEOL Ltd.), an Energy Dispersive X-ray Spectroscope (EDS) (Genesis-S-UTW, manufactured by EDAX Inc.), and a slow scan CCD camera (DigiView IV, manufactured by TSL, Inc.). The curve illustrated in FIG. 4 is a fitted curve drawn on the basis of the measurement results. FIG. 5 illustrates the crystal orientation distributions, measured using the EBSD method, for the Al—Ti—Si alloy films having the various Ti content values described above, and also illustrates the particle size distributions for the metal crystals, obtained by analysis of those crystal orientation distributions.

The average particle size illustrated in FIG. 4 increases rapidly as the Ti content is increased from 0% by weight, but when the Ti content exceeds about 0.8% by weight, the slope of the curve begins to moderate, and the average particle size eventually approaches a constant value. Based on the slope of this curve, it is thought that when the average particle size of the metal crystals falls to 1 μm or less, any broadening of the particle size distribution for the metal crystals is suppressed, even if a localized variation in the Ti content occurs in the Al alloy film. This effect is also evident from the particle size distributions illustrated in FIG. 5 for the metal crystals in the alloy films having a Ti content of 1.0% by weight or 3.2% by weight.

By comparing FIG. 3 and FIG. 4 it is evident that the shear strength and the average particle size of the metal crystals in the Al—Ti—Si alloy film exist in an inversely proportional relationship, meaning the smaller the average particle size of the metal crystals, the greater the increase in the shear strength of the Al—Ti—Si alloy film, and therefore the yield strength of the Al—Ti—Si alloy film. In particular, when the average particle size of the metal crystals is 1 μm or less, and preferably 0.8 μm or less, the Al—Ti—Si alloy film of the present embodiment has a markedly superior shear strength that is twice or more the shear strength of an Al—Si alloy film containing no Ti.

Next is a description of a method for producing the semiconductor device 100 illustrated in FIG. 1. First, the IGBT is formed in the semiconductor substrate 10. The method used for forming the IGBT can employ typical IGBT production methods. For example, epitaxial growth can be used to grow an n-type layer on the collector layer, and ion injection methods and the like then used to form the base layer, the channel layer and the emitter layer. Then, an RIE (Reactive Ion Etching) method is used to form the trenches, the inner walls of the trenches are oxidized by heating using a diffusion furnace or the like to form the gate insulation film 14, and the trenches are then filled with a polycrystalline silicon to form the gate electrode 12. The interlayer insulating film 16 is then formed.

Next, the film formed from the Al—Ti—Si alloy according to the present embodiment is formed on the semiconductor substrate 10 using a sputtering method or the like. Subsequently, a resist is applied to the surface of the Al—Ti—Si alloy film, a photolithography method is used to pattern the resist, and an RIE method is used to form the surface electrode 20 and a gate electrode pad and the like not shown in the drawing.

Subsequently, the back surface of the semiconductor substrate 10 is polished using a grinder or a lapping machine to adjust the thickness of the semiconductor substrate 10 and the smoothness of the back surface. Subsequently, a metal film containing, for example, aluminum as the main component is formed by sputtering or the like, thereby forming the back electrode 30.

The semiconductor device 100 is subjected to a sintering treatment in one of the steps following the formation of the surface electrode 20 and the back electrode 30. The sintering treatment is performed, for example, by heating the semiconductor device 100 at 400 to 500° C. for 10 to 60 minutes in a hydrogen atmosphere.

Following formation of the surface electrode 20, the polyimide film 40 is formed as a protective film. The polyimide film 40 is formed, for example, by applying a polyamic acid solution across the entire surface of the surface electrode 20, drying the applied layer, performing a heat treatment or the like to form a polyimide film, and then using a mask pattern to etch the polyimide film.

Subsequently, the second surface electrode 22, the third surface electrode 24, the second back electrode 32 and the third back electrode 34 are formed. The second back electrode 32 and the third back electrode 34 are formed by sputtering or the like.

An example of a step in which the second surface electrode 22 is formed by an electroless plating method is described below. First, the aluminum oxide film formed on the exposed portion of the surface electrode 20 is removed. Subsequently, the semiconductor substrate 10 is dipped in a bath containing palladium chloride or zinc chloride as the main component, and the aluminum of the surface electrode 20 is substituted with palladium or zinc to activate the surface. Excess palladium or zinc is then removed by washing with nitric acid or the like to prepare the surface. The substrate is then dipped in a bath containing nickel chloride and nickel sulfate as the main components, and also containing sodium hypophosphite, dimethylamine borane, sodium borohydride or hydrazine as a reducing agent, thereby causing the deposition of nickel to form the second surface electrode 22.

Subsequently, the semiconductor substrate 10 is dipped in either a gold displacement plating bath using a gold cyanide complex containing gold potassium cyanide as the main component, or a cyanide-free gold displacement plating bath containing gold chloride or gold thiosulfate as the main component, thereby forming a thin gold film with a thickness of 0.005 μm to 0.3 μm as the third surface electrode 24 on the surface of the second surface electrode 22, and completing the semiconductor device 100. The second back electrode and the third back electrode may be formed by an electroless plating method or a displacement gold plating method as required. The second and third back electrodes are connected to an external terminal via solder, a wire, or a metal foil or the like.

The semiconductor device of the present embodiment was described using the specific example of a semiconductor device provided with the vertical trench gate IGBT illustrated in FIG. 1, but the semiconductor device of the present embodiment is not limited to this specific example.

The invention claimed is:

1. A semiconductor device comprising:
   a semiconductor substrate, and
   an electrode formed from an alloy containing aluminum, silicon and titanium, wherein
   a content of the silicon in the electrode is from 0.5 to 1.0% by weight relative to a total weight of the electrode,
   a content of the titanium in the electrode is from 0.8 to 3.0% by weight relative to the total weight of the electrode, and
   a thickness of the electrode is at least 1 μm.

2. The semiconductor device according to claim 1, wherein
   an average particle size of metal crystals contained in the electrode is not more than 1 μm.

3. The semiconductor device according to claim 1, wherein
   an average particle size of metal crystals contained in the electrode is not more than 0.8 μm.

4. The semiconductor device according to claim 1, wherein
   the content of the titanium in the electrode is from 0.8 to 2.0% by weight relative to the total weight of the electrode.

5. The semiconductor device according to claim 2, wherein
   the content of the titanium in the electrode is from 0.8 to 2.0% by weight relative to the total weight of the electrode.

6. The semiconductor device according to claim 3, wherein
   the content of the titanium in the electrode is from 0.8 to 2.0% by weight relative to the total weight of the electrode.

7. The semiconductor device according to claim 1, wherein
   at least a portion of the silicon contained in the electrode is in a state not dissolved in the aluminum.

8. The semiconductor device according to claim 2, wherein
   at least a portion of the silicon contained in the electrode is in a state not dissolved in the aluminum.

9. The semiconductor device according to claim 3, wherein
   at least a portion of the silicon contained in the electrode is in a state not dissolved in the aluminum.

10. The semiconductor device according to claim 4, wherein
    at least a portion of the silicon contained in the electrode is in a state not dissolved in the aluminum.

11. The semiconductor device according to claim 5, wherein
    at least a portion of the silicon contained in the electrode is in a state not dissolved in the aluminum.

12. The semiconductor device according to claim 6, wherein
    at least a portion of the silicon contained in the electrode is in a state not dissolved in the aluminum.

13. The semiconductor device according to claim 1, wherein
    a content of the aluminum in the electrode is from 96.0 to 98.7% by weight relative to the total weight of the electrode.

14. The semiconductor device according to claim 1, wherein
    the thickness of the electrode is at least 1 μm and no more than 10 μm.

15. The semiconductor device according to claim 14, wherein
    the thickness of the electrode is at least 3 μm.

16. The semiconductor device according to claim 1, wherein
    the thickness of the electrode is at least 3 μm and no more than 8 μm.

17. The semiconductor device according to claim 1, wherein
    the thickness of the electrode is at least 4 μm and no more than 6 μm.

18. A semiconductor device comprising:
    a semiconductor substrate, and
    an electrode formed from an alloy containing aluminum, silicon and titanium, wherein
    a content of the silicon in the electrode is from 0.5 to 1.0% by weight relative to a total weight of the electrode,
    a content of the titanium in the electrode is from 0.8 to 3.0% by weight relative to the total weight of the electrode,
    a content of the aluminum in the electrode is from 96.0 to 98.7% by weight relative to the total weight of the electrode, and
    a thickness of the electrode is at least 1 μm and no more than 10 μm.

19. The semiconductor device according to claim 18, wherein
    the thickness of the electrode is at least 3 μm.

* * * * *